June 28, 1960 M. J. RELIS 2,943,261

PULSE SIGNAL FILTER

Filed Sept. 26, 1958 4 Sheets-Sheet 1

INVENTOR.
MATTHEW J. RELIS
BY
Eli Weiss
ATTORNEY

June 28, 1960 M. J. RELIS 2,943,261

PULSE SIGNAL FILTER

Filed Sept. 26, 1958 4 Sheets-Sheet 2

INVENTOR.
MATTHEW J. RELIS
BY
Eli Weiss
ATTORNEY

June 28, 1960

M. J. RELIS 2,943,261

PULSE SIGNAL FILTER

Filed Sept. 26, 1958

4 Sheets-Sheet 3

INVENTOR.
MATTHEW J. RELIS
BY
Eli Weiss
ATTORNEY

INVENTOR.
MATTHEW J. RELIS
BY
Eli Weiss
ATTORNEY

United States Patent Office 2,943,261
Patented June 28, 1960

2,943,261

PULSE SIGNAL FILTER

Matthew J. Relis, Bayside, N.Y., assignor to Burroughs Corporation, Detroit, Mich., a corporation of Michigan Filed Sept. 26, 1958, Ser. No. 763,737
17 Claims. (Cl. 328—108)

This invention relates generally to a pulse signal filter and more particularly to a device that isolates a train of pulse signals having an unknown repetition rate from a group of pulse signals.

Often, generated information that must be transmitted from one area to another is first converted into a group or train of pulse signals having a preselected time spacing or duration between adjacent pulse signals. Variations in the generated information is indicated by variations in the time spacing between adjacent pulse signals. Thus, each desired value of generated information can be represented by a group of pulse signals having a discrete repetition rate. Unfortunately, however, physical limitations and economic considerations often require the simultaneous transmissions of a multiple number of groups of pulse signals over a common channel.

Since a change in repetition rate of the pulse signals of any one group of pulse signals indicates a change of generated information; and, since the repetition rate of each group of pulse signals from any one source must be variable over a predetermined range to cover the desired limits of information generated, difficulties present themselves when an attempt is made to isolate a group of pulse signals having a substantially fixed—but not predetermined repetition rate—from a multiple number of groups of pulse signals having other substantially fixed—but not predetermined repetition rates.

To further define the problem presented, assume that a first variable oscillator and a second variable oscillator are coupled to feed pulse signals over a common channel simultaneously; and that the first variable oscillator generates pulse signals having a first repetition rate, and the second variable oscillator generates pulse signals having a second repetition rate. The first variable oscillator is controlled to step or shift sequentially the group of pulse signals generated from a first repetition rate to another repetition rate, and to still another repetition rate. The second variable oscillator is controlled to operate in the same manner. However, output pulse signals of the two oscillators are stepped to new repetition rates independently of each other and each oscillator covers a range not covered by the other.

Thus, it readily becomes obvious, that difficulties present themselves when an attempt is made to isolate the groups of pulse signals from each other.

It is an object of this invention to provide a device that can isolate a train of pulse signals having an undetermined repetition rate from other trains of pulse signals where each has a different undetermined repetition rate.

It is another object of this invention to provide a device that can pass a train of pulse signals having a first fixed but undetermined repetition rate and then, after termination, pass another train of pulse signals having a second fixed but undetermined repetition rate.

It is still another object of this invention to provide a device that can isolate the train of pulse signals having the highest frequency from a plurality of trains of pulse signals of different undetermined frequencies.

It is also an object of this invention to provide a device that can pass a group of pulse signals having a frequency that is subject to drift.

It is also an object of this invention to provide a device that is economical to build and reliable in operation.

Other objects and many of the attendant advantages of this invention will be readily appreciated as the apparatus becomes better understood by reference to the following detailed description when considered in connection with the accompanying drawings wherein:

Figs. 1*a* and 1*b* are block diagrams in accordance with the principles of this invention;

Briefly, groups or trains of pulse signals each having a distinctive rate of occurrence or repetition are fed simultaneously to a pulse filter. The pulse filter passes one train of pulse signals, and blocks the others. However, if the pulse filter supports one output terminal for each group of pulse signals, then each group of pulse signals will be separated from each other and a particular group of pulse signals will appear at each of the output terminals.

To facilitate the explanation of this invention it can be assumed that the pulse filter is composed of an input network, a timing network, and a reset network. The input network is connected to receive the group of pulse signals transmitted simultaneously over a channel to initiate a lock-on condition after sensing the minimum information (first two appearing pulses) required to indicate the presence of a pulse train; the timing network maintains or holds the lock-on condition initiated by the input network; and the reset network resets the input network and the timing network to a ready state immediately after the group of pulse signals being passed becomes discontinuous. Resetting of the input network enables it to lock-on to another group of pulse signals having the same or another repetition rate.

The pulse filter is designed initially to respond to groups of pulse signals having repetition rates which fall within a particular band defined by predetermined minimum and maximum values. Since only two consecutive pulses are required to indicate the phasing and repetition rate of a group of pulse signals having a substantially constant repetition rate, and the absence of a single pulse indicates discontinuity of the group of pulse signals being passed, the device does not lock-on to a group of pulse signals until it senses the first two pulse signals of a desired group of pulse signals, and remains lock-on and passes that group of pulse signals until the signal becomes discontinuous.

Figure 1A:
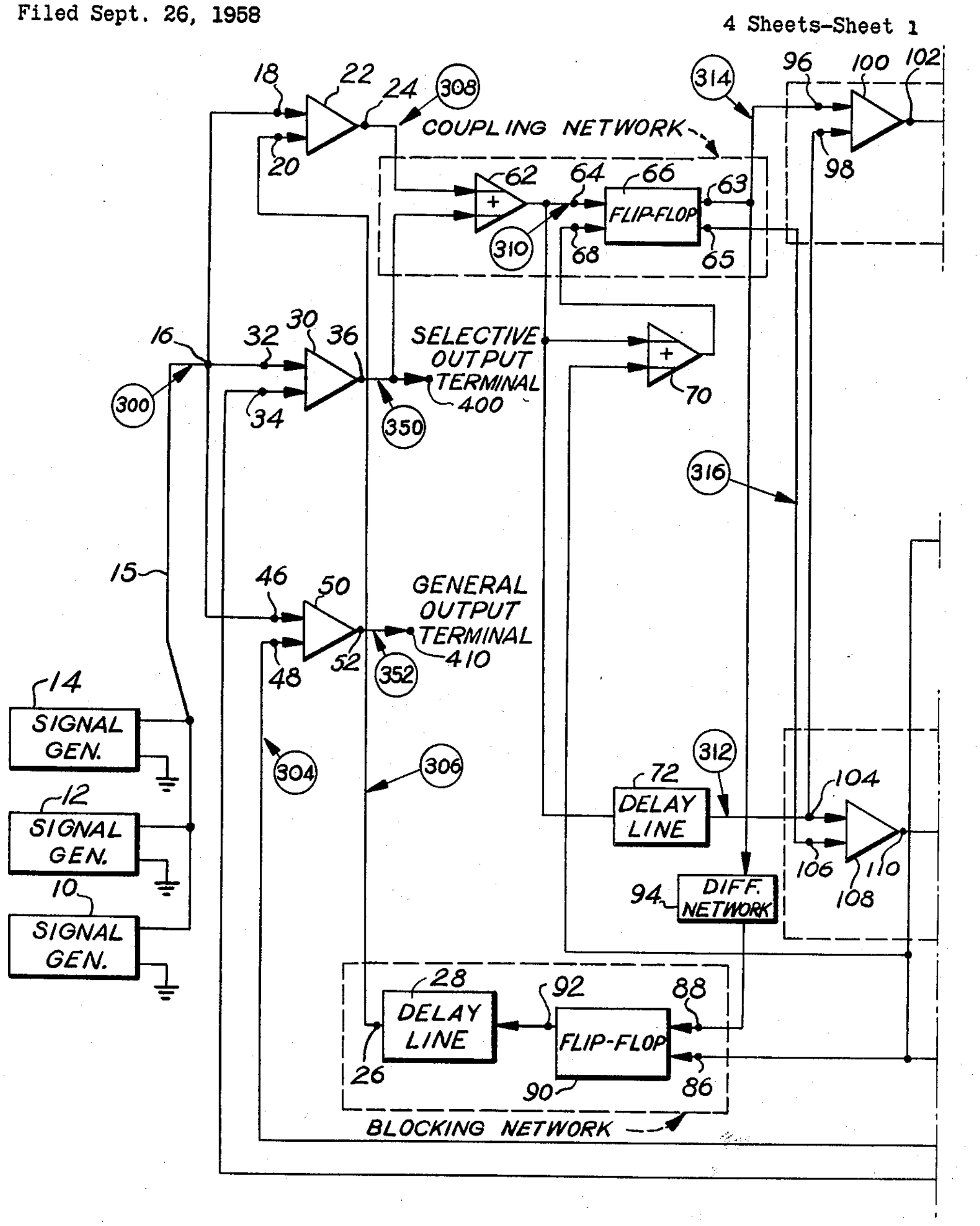
Figure 1B:
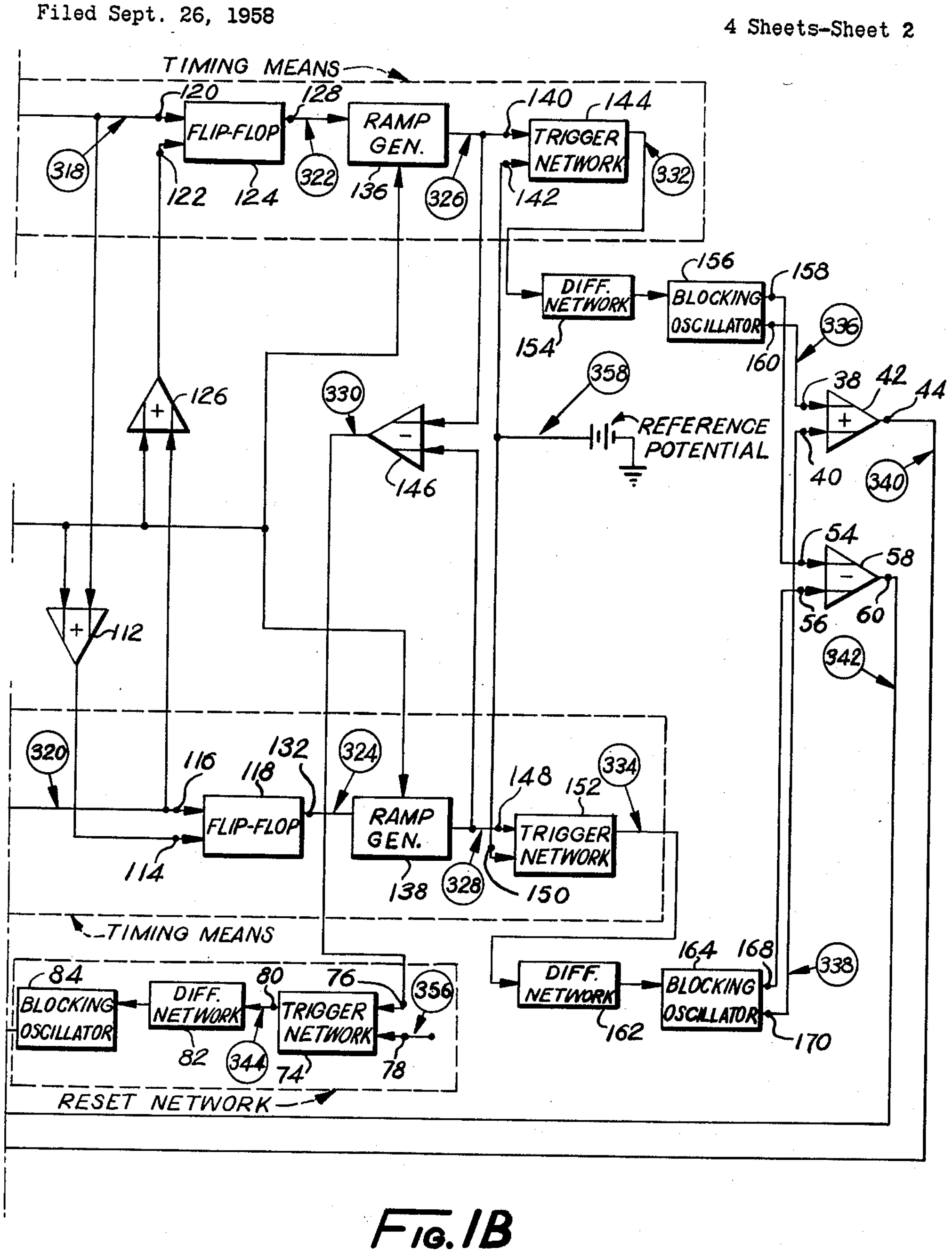

With reference to Figs. 1*a* and 1*b*, a multiple number of pulse signal generators 10, 12, and 14 are coupled to feed groups or trains of pulse signals over a common channel 15 simultaneously to an input terminal 16 of a pulse filter. Terminal 16 is coupled to three switching means or AND gates 22, 30 and 50. The AND gate 22 supports two input terminals 18 and 20, and an output terminal 24; AND gate 30 supports two input terminals 32 and 34, and an output terminal 36; and AND gate 50 supports two input terminals 46 and 48, and an output terminal 52. The input terminal 16 is coupled to the terminals 18, 32, and 46 of AND gates 22, 30 and 50 respectively. Input terminal 20 is coupled to the output terminal 26 of delay line 28; terminal 34 is coupled to the output terminal 44 of an OR gate 42 which supports two input terminals 38 and 40; and the terminal 48 is coupled to the output terminal 60 of OR gate 58 which supports two input terminals 54 and 56.

Signals that appear at the output terminals 24 and 36 of AND gates 22 and 30 respectively are fed through an OR gate 62 to a set terminal 64 of a flip flop 66, and also through an OR gate 70, and a delay line 72. The output terminal of the OR gate 70 is connected to the reset terminal 68 of the flip flop 66. The OR gate 62 and the flip flop 66 function as a coupling network.

A trigger network 74 such as a Schmitt trigger supports an input terminal 76, a reference terminal 78, and an output terminal 80. The output terminal 80 is coupled to feed a signal through a differentiator network 82 to a blocking oscillator 84. The output signal from the blocking oscillator 84 is fed to the reset terminal 86 of a flip flop 90, and to an input terminal of the OR gate 70. The output terminal 92, of the flip flop 90 is coupled to the input terminal of the delay line 28. The Schmitt trigger 74, differentiator network 82, and blocking oscillator 84 function as a reset means or network. The flip flop 90 and the delay line 28 function as a blocking network.

The flip flop 66 supports two output terminals 63 and 65. Terminal 63 is coupled through a differentiator network 94 to the input set terminal 88 of the flip flop 90; and is coupled directly to an input terminal 96 of an AND gate 100.

The output signal from the delay line 72 is fed to the other input terminal 98 of the AND gate 100; and is also fed to an input terminal 104 of an AND gate 108. The signal that appears on the output terminal 65 of the flip flop 66 is fed to the other input terminal 106 of the AND gate 108.

The output signal from the AND gate 100 is fed through an OR gate 112 to the input reset terminal 114 of a flip flop 118; and is also fed to an input set terminal 120 of a flip flop 124. The output signal from the AND gate 108 is fed through an OR gate 126 to the input reset terminal 122 of the flip flop 124; and to an input set terminal 116 of the flip flop 118. The output terminal 128 of the flip flop 124 is coupled to a triangular waveform generator also referred to as a ramp generator 136; and the output terminal 132 of the flip flop 118 is coupled to another triangular waveform or ramp generator 138. A block and schematic diagram of the generators 136 and 138 is shown in Fig. 3, and will be referred to in more detail shortly.

The output signal from the blocking oscillator 84 is fed to the input terminals of the OR gates 112 and 126, and to the reset terminals of the ramp generators 136, and 138. The output signal from the generator 136 is fed to an input terminal 140 of a trigger network 144 such as a Schmitt trigger or the like; and to a first input terminal of an OR gate 146. The output signal from the generator 138 is fed to an input terminal 148 of a trigger network 152 such as a Schmitt trigger or the like; and to a second input terminal of the OR gate 146. The output signal of the OR gate 146 is fed to the input terminal 76 of the Schmitt trigger network 74. A D.-C. reference potential signal 356 is fed to the reference terminal 78 of the Schmitt trigger network 74; and another D.-C. reference potential signal 358 is fed to the reference terminals 142 and 150 of the Schmitt trigger networks 144 and 152 respectively. The output signal of the Schmitt trigger network 144 is fed through a differentiator network 154 to a blocking oscillator 156; and the output signal of the Schmitt trigger network 152 is fed through a differentiator network 162 to a blocking oscillator 164. AND gate 108, flip flop 118, generator 138, and trigger network 152 combine to function as a first timing means; and AND gate 100, flip flop 124, generator 136, and trigger network 144 combine to function as a second timing means. The first and second timing means or timing signal generating networks generate timing signals. The blocking oscillator 156 supports output terminals 158 and 160. Output terminal 158 is connected to the input terminal 54 of the OR gate 58, and output terminal 160 is connected to the input terminal 38 of the OR gate 42.

The blocking oscillator 164 supports output terminals 168 and 170. Output terminal 168 is connected to the input terminal 56 of the OR gate 58; and output terminal 170 connected to the input terminal 40 of the OR gate 42. As noted previously, the output terminal 44 of OR gate 42 is connected to the input terminal 34 of AND gate 30; the output terminal 60 of OR gate 58 is connected to the input terminal 48 of AND gate 50; and the output terminal 26 of delay line 28 is connected to the input terminal 20 of AND gate 22.

Figure 3:
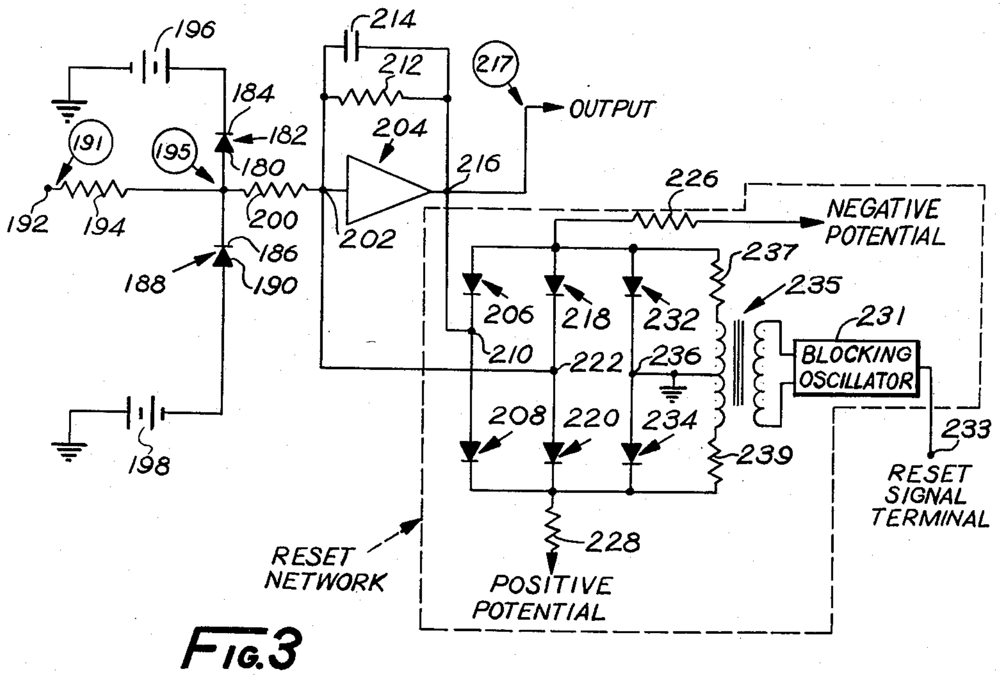
Fig. 3 is a more detailed diagram of a triangular waveform or ramp generator network shown in Fig. 6.

With reference to Fig. 3 there is illustrated more fully a block and schematic diagram of the triangular waveform or ramp generator which can also be referred to as a positive-negative slope ramp generator.

The anode 180 of a crystal diode 182 is connected to the cathode 186 of crystal diode 188, and also to an input terminal 192 through a resistor 194. The cathode 184 of diode 182 is connected to a source of positive D.-C. potential 196; and the anode 190 of crystal diode 188 is connected to a source of negative D.-C. potential 198. A resistor 200 connects the anode 180 of diode 182 to the input terminal 202 of D.-C. amplifier 204. A resistor 212 and a capacitor 214 each are coupled between the input terminal 202 and output terminal 216 of the amplifier 204. A first pair of series coupled crystal diodes 206 and 208 is coupled in parallel with a second pair of series coupled diodes 218 and 220, and in parallel with a third pair of series coupled crystal diodes 232 and 234. A point 210 common to the diodes 206 and 208 is coupled to the output terminal 216 of the amplifier 204; and the point 222 common to the diodes 218 and 220 is coupled to the input terminal 202 of the amplifier 204.

The anode terminals of the crystal diodes 206, 218 and 232 are each coupled through a common resistor 226 to a source of negative potential; and the cathode terminals of the crystal diodes 208, 220, and 234 are each coupled through a common resistor 228 to a source of positive potential.

A blocking oscillator 231, activated by the application of a signal to a reset terminal 233 feeds the primary winding of an isolation transformer 235.

The secondary winding of the transformer 235 supports a center tap which is coupled to a ground terminal, and to the point 236 common to the crystal diodes 232 and 234. One end of the secondary winding is coupled to the anode terminals of crystal diodes 232, 218, and 206 through a resistor 237; and the other end of the secondary winding is coupled to the cathode terminals of crystal diodes 234, 220, and 208 through a resistor 239.

In operation, the D.-C. potential fed to the cathode 184 of diode 182 is more positive than the D.-C. potential fed to the anode 190 of diode 188; the input signals are fed to the input terminal 192; reset signals are fed to terminal 233; and output signals appear at the output terminal 216 of the amplifier 204.

The circuit is based on the Miller integrator circuit or negative-feedback linear sweep generator. The slopes of the positive and negative ramps are equal and are determined by the relationship;

$$\frac{de}{dt}=\frac{E196-E198}{(R200)(C214)}$$

where

E196 is the D.-C. potential of source 196;
E198 is the D.-C. potential of source 198;
R200 is the value of the resistor 200; and
C214 is the value of the capacitor 214.

The resistor 212 prevents drift in the circuit and, to have a negligible effect on the operating characteristics of the integrator, it has a very large value compared to the resistor 200.

The direct coupled amplifier 204 is initially adjusted to generate a zero output potential when a zero input potential is fed to its input terminal 202. During operation of the integrator each of the crystal diodes in the reset network of Fig. 3 is normally held in its cut off condition by a back bias signal. Upon completion of the operation of the integrator, a reset pulse signal is fed through the reset terminal 233 to activate the blocking oscillator 231. The signal from the blocking oscillator drives the diodes into a conductive state. The anode of crystal diode 232, and the cathode of crystal diode 234 are each clamped to small potentials of equal but opposite polarity around ground potential. When this condition exists the terminals 202 and 216 are clamped very close to ground potential, and capacitor 214 discharges. The reset pulse signal must have a time duration sufficient to allow capacitor 214 to discharge completely.

Figure 4:
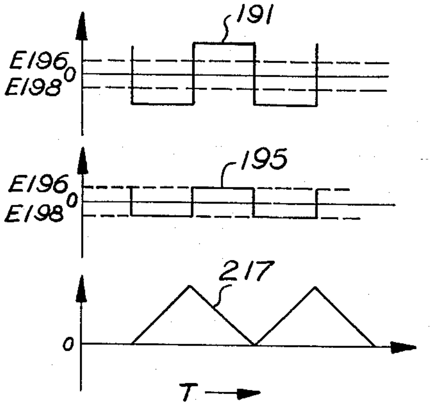
Fig. 4 is a diagram of the waveforms associated with the network of Fig. 3.

The waveforms illustrated in Fig. 4 apply to the circuit disclosed in Fig. 3. E196 is the fixed D.-C. potential from the source 196; and E198 is the fixed D.-C. potential from the source 198. The pulse signal 191 is fed to the input terminal 192; the pulse signal 195 appears at the junction of the resistors 194 and 200; and the signal 217 appears at the output terminal 216.

With reference to Fig. 1, in operation, groups or trains of pulse signals where each group of pulse signals has a distinctive repetition rate are fed to the input terminal 16. Initially, each flip flop 66, 90, 118 and 124 is in the reset condition, and the AND gates 22 and 50 are enabled to pass input pulse signals fed to the input terminal 16.

Each AND gate is constructed to generate a positive potential signal at its output terminal only when a positive potential signal is present on each of its input terminals simultaneously.

The "OR" gates that display a + (plus) sign perform the "OR" function with respect to positive signals. I.e., if A and B are input signals, and C is the output signal, then C will be positive if A and/or C is positive; and in the OR gates that display a — (minus) sign C will be negative only if A and/or B is negative.

Figure 2:
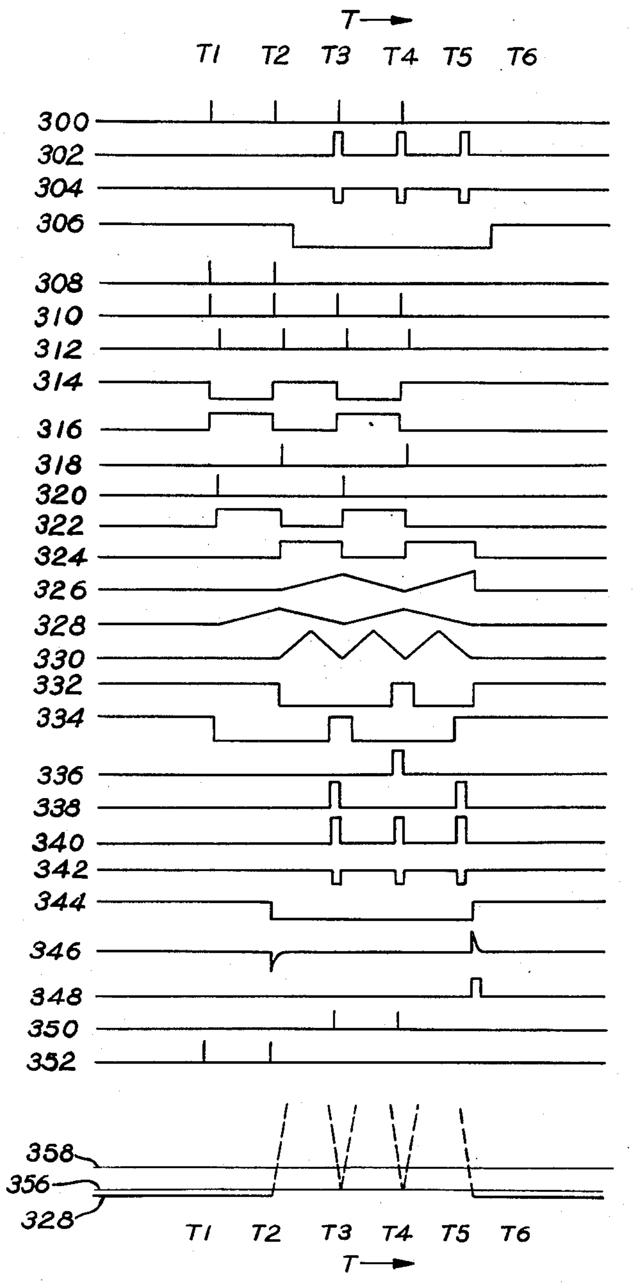
Fig. 2 is a diagram of the waveforms associated with the structure illustrated in Figs. 1*a* and 1*b*.

In the following explanation reference should be made of the waveforms of Fig. 2. The location of each numbered waveform illustrated in Fig. 2 is marked on Figs. 1*a* and 1*b* by means of an arrow connected to a circle positioned around the associated waveform number.

To simplify the explanation of the operation of this invention, it shall be assumed that a single group of pulse signals 300 of determinable but unknown repetition rate is fed to the input terminal 16.

The first pulse of the input signal 300 passes through the initially enabled AND gates 22 and 50, but is blocked by AND gate 30. The output signal 308 of AND gate 22 is fed through OR gate 62 to set flip flop 66. The output signal 310 of OR gate 62 is also fed through delay line 72. Thus, at time T1, an output pulse signal 352 appears at the output terminal of AND gate 50, and the flip flop 66 has been set. The setting of flip flop 66 activates the lower of the two timing means by enabling AND gate 108.

The pulse signal 310 which sets the flip flop 66 is delayed in the delay line 72 to provide the waveform signal 312 which is fed to and passes through the enabled AND gate 108. The output signal 320 from AND gate 108 is fed to and sets the flip flop 118 to generate a pulse signal 324 which is fed to and initiates operation of the ramp generator or triangular waveform generator 138. The output signal 328 from the ramp generator 138 rises and almost immediately sets the Schmitt trigger network 152. As soon as the trigger network 152 is set it generates a negative potential step signal 334, and continues to generate this signal until a second pulse signal is fed to its input terminal.

At time T2, a second pulse of the signal 300 is fed to the input terminal 16 and passes through AND gates 22 and 50 while being blocked by AND gate 30. The output signal 308 from AND gate 22 passes through OR gate 62 and is then fed through OR gate 70 to reset flip flop 66. The signal 310 from the OR gate 62 is also fed to the delay line 72. The resetting of flip flop 66 generates a negative going pulse signal 316 which inhibits or closes AND gate 108; and also generates a positive going pulse signal 314 which enables or opens AND gate 100. At the same instant, the signal 314 is fed through the differentiator network 94 to set the flip flop 90. The output signal from the flip flop 90 is delayed slightly in delay line 28, represented by signal 306, and is fed to and closes AND gate 22. Thus, slightly after time T2, or after the receipt of the first two pulses, the initially opened AND gate 22 closes to block the passage of all subsequent arriving pulse signals. The blocking means or network consisting of the flip flop 90 and the delay line 28 will continue to generate a blocking pulse signal until a reset pulse signal is fed to the flip flop 90.

Signal 318 represents the delayed pulse signal from the delay line 72 after passing through AND gate 100. The output signal 318 from the gate 100 is fed to and sets flip flop 124 which, through signal 322, initiates operation of the ramp generator 136 to cause signal 326 to be generated. Signal 318 is also fed through OR gate 112 to reset flip flop 118 which, in turn, reverses the slope of the output signal 328 of the ramp generator 138.

The positive and negative slopes of the signals generated by each of the ramp generators are identical in absolute magnitude. However, it is not necessary for the magnitude of the slope of the signal from one generator to be equal to the magnitude of the slope of the signal from the other generator. As soon as the potential of the signal generated by the ramp generator 138 falls below the D.-C. reference potential 358 fed to the trigger network 152, the trigger network 152 resets and generates a positive potential step signal 334 which is fed through the differentiator network 162 to activate the blocking oscillator 164. The positive and negative output signals from the blocking oscillator 164 are fed through the OR gates 42, and 58 respectively; the positive signal being utilized to enable or open AND gate 30, and the negative signal being utilized to inhibit or close AND gate 50. At this instant AND gate 30 is opened and AND gate 50 is closed, and the system is now locked-on to the input signal 300. All pulse signals present after time T2 will appear at the output terminal 36 of AND gate 30.

During the interval of time T2 through T4, in this illustration, the system is locked on to the signal 300, having the same repetition rate as the first two pulses, and every pulse of signal 300 that appears after time T2 will pass through the AND gate 30. During this period, each pulse signal passed through AND gate 30 will be fed through the coupling means or network consisting of the OR gate 62 and the flip flop 66 to change the conductive state of the flip flop 66 as indicated by signals 314, and 316 to alternately set and reset flip flops 124 and 118 to produce pulse signals 322, and 324 respectively. The activation of the flip flops initiate and reverse the operation of their respective ramp generators 136, and 138 to generate the pulse signals 326, and 328 respectively. The blocking oscillators 156, and 164 are activated alternately to generate the pulse signals 336, and 338 which are utilized to inhibit or close AND gate 50 and to enable or open AND gate 30.

The time interval from the instant when the output signal from a ramp generator first assumes a positive slope, to the instant when the output signal from the ramp generator first assumes a negative slope is determined by the time interval between the pulses in signal 300. The ramp generator "remembers" this time interval by means of a crest voltage having a potential proportional to this time interval. After the slope reverses, an almost equal interval of time is required for the ramp voltage to drop to the point at which the trigger network will reset and generate a gating pulse which will allow another pulse of signal 300 through AND gate 30, but will prevent it from passing through AND gate 50.

The Schmitt trigger networks are preferably of the low hysteresis type, i.e., the voltage at which they set for increasing input signal is equal to the voltage at which they set for decreasing input signal.

The required width of the output signal of the blocking oscillator is determined by jitter or frequency modulation present in the pulse train, by the width of the pulses in the train or group of pulse signals, and by delays inherent in the system. If the repetition rate of the signal being passed changes, this system will automatically change its mode of operation to pass the train or group of pulse signals having the new repetition rate.

If the change is slow, gate 30 will continue to pass and gate 50 will continue to inhibit the pulses of signal 300 without exception. If the change is sudden, and sufficiently great, gate 30 will operate to block the signal while gate 50 will pass the signal. However, after a short interval of time gate 30 will again be conditioned to pass the new signals.

A portion of curve 328 has been expanded vertically and is shown superimposed on curves representing the D.-C. potential signals 356 and 358. The potential of signal 358 is greater or more positive than the potential of signal 356. When the signal 300 becomes discontinuous as indicated at time T5 by the absence of a pulse signal, one of the ramp generators returns to its normal or initial condition. As the output signal from the ramp generator becomes more negative than the potential 358, Schmitt trigger network 144 or 152 is reset. Continued absence of signal 300 during the duration of the blocking oscillator 156 or 164 indicates a break in the pulse train, and the output signal from the corresponding ramp generator continues to fall until it becomes more negative than the potential 356, at which time the resetting Schmitt trigger network 74 activates the reset means or network via OR gate 146. The output signal from Schmitt trigger network 74 is first differentiated and then fed to trigger the blocking oscillator 84.

The output signal from the blocking oscillator 84 is fed through OR gate 70 to reset flip flop 66; through OR gate 126 to reset flip flop 124; and through OR gate 112 to reset flip flop 118. The output signal from the blocking oscillator 84 is also fed to the ramp generators 136 and 138 to discharge them to their initial or not active condition. The output signal from the reset network is also fed to the blocking network to reset flip flop 90 which generates a signal that is fed to and enables AND gate 22 after a short time delay. Thus, after interruption of a pulse train by failure of a pulse to appear at the proper instant, the system resets and becomes ready to be reconditioned to isolate and pass a pulse signal train having the same or another frequency from a group of pulse signals.

Initially, AND gates 22 and 50 are opened to pass all pulse signals; and AND gate 30 is closed to block all pulse signals. The first arriving pulse signal passes through AND gate 22 and through the coupling means or network to initiate the activation of a first timing means. The first pulse signal (appearing at time T1) is also passed through AND gate 50. The second arriving pulse signal passes through AND gate 22 and through the coupling means or network to initiate the activation of a second timing means; and to reverse the operation of the first timing means. The second pulse signal (at time T2) that appears at the output of the coupling means or network is also utilized to activate a blocking means or network which closes AND gate 22.

At this instant the device becomes locked on and remains locked-on to a train or group of pulse signals having a repetition rate equal to the repetition rate determined by the time spacing between the first and second signal pulses. It shall be assumed that this spacing or duration is "S." Immediately prior to the arrival of a next appearing pulse spaced a distance "S" from the second pulse signal, the first and second timing means initiates the generation of pulse signals which open AND gate 30 and close AND gate 50. Thus, if there are any other pulse signals present between the second and third pulse signals they will be passed by AND gate 50 and blocked by AND gate 30 The next or third pulse signal spaced by an interval "S" from the second pulse signal is passed through AND gate 30, and through the coupling means or network to again initiate the activation of the timing means. Immediately after the third pulse signal is passed by the AND gate 30, AND gate 30 closes and AND gate 50 opens. The alternate activation or opening and deactivation or closing of the AND gates 30 and 50 continues during the presence of a group of pulse signals of uniform or gradually changing spacing to pass only all such pulse signals to the selective output terminal 400; and to pass all other occurring pulse signals to the general output terminal 410.

As soon as the desired group of pulse signals becomes discontinuous, the reset means is activated to reset the first and second timing means to close AND gate 30 and open AND gate 50; and to activate the blocking means or network to open AND gate 22.

At this instant the device is conditioned to lock on to and pass another group of pulse signals having a fixed but not predetermined repetition rate.

In the case where a multiple number of groups of pulse signals, each with a distinctive repetition rate, are fed to the input terminal, if one group of pulse signals is applied first, the filter will lock on to it and will remain locked on regardless of the presence of other groups or trains of pulse signals except under the very special case when one of the other groups of pulse signals has a repetition rate, or a repetition rate submultiple that is slightly greater than the original group of pulse signals. In this case the new group of pulse signals may "capture" the filter from a previous pulse train.

In the case where a multiple number of groups of pulse signals each with a distinctive frequency are fed to the input terminal simultaneously the pulse filter will "lock-on" to the group of pulse signals represented by the first two pulses that occur in succession from a single group of pulse signals without any intervening pulses from other groups of pulse signals. Such a situation must always occur, given enough time. This invention will lock-on to and pass that group of pulse signals to which the two pulses sensed belong, and the group of pulse signals locked-on to will be that group that has the highest repetition rate.

By cascading pulse filter of the type disclosed such that the input terminal of a succeeding filter is connected to receive its signal from the output terminal of AND gate 50 of the preceding filter, then each filter can isolate a distinctive group of pulse signals. The AND gate 30 of each filter will pass only the group of pulse signals that that particular pulse filter is locked on to, and the AND gate 50 of each pulse filter will pass all other groups of pulse signals. In this type of utilization, the first filter of the chain locks on to and separates the group of pulse signals having the highest repetition rate from all of the groups of pulse signals, and passes the rest; the second pulse filter locks on to and separates the group of pulse signals having the highest repetition rate from all of the groups of pulse signals passed by the first pulse filter, and passes the rest. This continues until each group of pulse signals is isolated, or each pulse filter is operating.

Obviously many modifications and variations of the present invention are possible in the light of the above teaching. It is therefore to be understood that within the scope of the appended claims the invention may be practiced otherwise than as specifically described.

What is claimed is:

1. A pulse signal filter comprising a first switching means conditioned initially to pass signals fed by a source of pulse signals, timing means activated by said first switching means to anticipate the time of occurrence of a next related signal, blocking means coupled to condition said first switching means to block pulse signals after said timing means is activated, a second switching means conditioned selectively by said timing means to pass the anticipated signal, and coupling means to feed the signal passed by said second switching means to said timing means to again condition selectively said second switching means to pass another anticipated signal.

2. A pulse signal filter comprising a first switching means conditioned initially to pass signals fed by a source of pulse signals, a first timing signal generating network and a second timing signal generating network each activated by said first switching means to anticipate the time of occurrence of a next related signal, blocking means coupled to condition said first switching means to block pulse signals after said first and second timing signal generating networks are activated, a second switching means conditioned selectively by said first and second timing signal generating networks to pass the anticipated signal, and coupling means to feed the signal passed by said second switching means to said first and second timing signal generating networks to again condition selectively said second switching means to pass another anticipated signal.

3. A pulse signal filter comprising a first switching means conditioned initially to pass signals fed by a source of pulse signals, timing means activated by said first switching means to anticipate the time occurrence of a next related signal, blocking means coupled to condition said first switching means to block pulse signals after said timing means is activated, a second switching means conditioned selectively by said timing means to pass the anticipated signal, and reset means coupled to condition said first switching means to pass signals and to said second switching means to block signals when the anticipated signal is absent.

4. A pulse signal filter comprising a first switching means conditioned initially to pass signals fed by a source of pulse signals, a first timing signal generating network and a second timing signal generating network each activated by said first switching means to anticipate the time of occurrence of a next related signal, blocking means coupled to condition said first switching means to block pulse signals after said first and second timing signal generating networks are activated, a second switching means conditioned selectively by said first and second timing signal generating networks to pass the anticipated signal, and reset means coupled to condition said first switching means to pass signals and to said second switching means to block signals when the anticipated signal is absent.

5. A pulse filter circuit comprising a first AND gate conditioned initially to pass signals fed by a source of pulse signals, a first timing signal generating network and a second timing signal generating network each activated by said first AND gate to anticipate the time of occurrence of a next related signal, blocking means coupled to condition said first AND gate to block pulse signals after said first and second timing signal generating networks are activated, a second AND gate conditioned selectively by said first and second timing signal generating networks to pass the anticipated signal, and reset means coupled to condition said first AND gate to pass signals and to said second AND gate to block signals when the anticipated signal is absent.

6. A pulse signal filter comprising a first switching means conditioned initially to pass signals fed by a source of pulse signals, timing means activated by said first switching means to anticipate the time occurrence of a next related signal, blocking means coupled to condition said first switching means to block pulse signals after said timing means is activated, a second switching means conditioned selectively by said timing means to pass the anticipated signal, coupling means to feed the signal passed by said second switching means to said timing means to again condition selectively said second switching means to pass another anticipated signal, and reset means coupled to condition said first switching means to pass signals and said second switching means to block signals when the anticipated signal is absent.

7. A pulse signal filter comprising a first switching means conditioned initially to pass signals fed by a source of pulse signals, a first timing signal generating network and a second timing signal generating network each activated by said first switching means to anticipate the time of occurrence of a next related signal, blocking means coupled to condition said first switching means to block pulse signals after said first and second timing signal generating networks are activated, a second switching means conditioned selectively by said first and second timing signal generating networks to pass the anticipated signal, coupling means to feed the signal passed by said second switching means to said first and second timing signal generating networks to again condition selectively said second switching means to pass another anticipated signal, and reset means coupled to condition said first switching means to pass signals and said second switching means to block signals when the anticipated signal is absent.

8. A pulse signal filter comprising a first AND gate conditioned initially to pass signals fed by a source of pulse signals, a first timing signal generating network and a second timing signal generating network each activated by said first AND gate to anticipate the time of occurrence of a next related signal, blocking means coupled to condition said first AND gate to block pulse signals after said first and second timing signal generating networks are activated, a second AND gate conditioned selectively by said first and second timing signal generating networks to pass the anticipated signal, coupling means to feed the signal passed by said second AND gate to said first and second timing signal generating networks to again condition selectively said second AND gate to pass another anticipated signal, and reset means coupled to condition said first AND gate to pass signals and said second AND gate to block signals when the anticipated signal is absent.

9. A pulse signal filter comprising a first switching means conditioned initially to pass signals fed by a source of pulse signals, timing means activated by said first switching means to anticipate the time occurrence of a next related signal, blocking means coupled to condition said first switching means to block pulse signals after said timing means is activated, a second switching means conditioned selectively by said timing means to pass the anticipated signal, and a third switching means coupled to said source of pulse signals and conditioned selectively by said timing means to block signals when said second switching means is conditioned to pass pulse signals.

10. A pulse signal filter comprising a first switching means conditioned initially to pass signals fed by a source of pulse signals, a first timing signal generating network and a second timing a signal generating network each activated by said first switching means to anticipate the time of occurrence of a next related signal, blocking means coupled to condition said first switching means to block pulse signals after said first and second timing signal generating networks are activated, a second switching means conditioned selectively by said first and second timing signal generating networks to pass the anticipated signal, and a third switching means coupled to said source of pulse signals and conditioned selectively by said first and second timing signal generating networks to block signals when said second switching means is conditioned to pass pulse signals.

11. A pulse signal filter comprising a first AND gate conditioned initially to pass signals fed by a source of pulse signals, a first timing signal generating network and a second timing signal generating network each activated by said first AND gate to anticipate the time of occurrence of a next related signal, blocking means coupled to condition said first AND gate to block pulse signals after said first and second timing signal generating networks are activated, a second AND gate conditioned selectively by said first and second timing signal generating networks to pass the anticipated signal, and a third AND gate coupled to said source of pulse signals and conditioned selectively by said first and second timing signal generating networks to block signals when said second AND gate is conditioned to pass pulse signals.

12. A pulse signal filter comprising a first switching means conditioned initially to pass signals fed by a source of pulse signals, timing means activated by said first switching means to anticipate the time occurrence of a next related signal, blocking means coupled to condition said first switching means to block pulse signals after said timing means is activated, a second switching means conditioned selectively by said timing means to pass the anticipated signal, a third switching means coupled to said source of pulse signals and conditioned selectively by said timing means to block signals when said second switching means is conditioned to pass pulse signals, and coupling means to feed the signal passed by said second switching means to said timing means to again condition selectively said second switching means to pass another anticipated signal.

13. A pulse signal filter comprising a first switching means conditioned initially to pass signals fed by a source of pulse signals, a first timing signal generating network and a second timing signal generating network each activated by said first switching means to anticipate the time of occurrence of a next related signal, blocking means coupled to condition said first switching means to block pulse signals after said first and second timing signal generating networks are activated, a second switching means conditioned slectively by said first and second timing signal generating networks to pass the anticipated signal, a third switching means coupled to said source of pulse signals and conditioned selectively by said first and second timing signal generating networks to block signals when said second switching means is conditioned to pass pulse signals, and coupling means to feed the signal passed by said second switching means to said first and second timing signal generating networks to again condition selectively said second switching means to pass another anticipated signal.

14. A pulse signal filter comprising a first AND gate conditioned initially to pass signals fed by a source of pulse signals, a first timing signal generating network and a second timing signal generating network each activated by said first AND gate to anticipate the time of occurrence of a next related signal, blocking means coupled to condition said first AND gate to block pulse signals after said first and second timing signal generating networks are activated, a second AND gate conditioned selectively by said first and second timing signal generating networks to pass the anticipated signal, a third AND gate coupled to said source of pulse signals and conditioned selectively by said first and second timing signal generating networks to block signals when said second AND gate is conditioned to pass pulse signals, and coupling means to feed the signal passed by said second AND gate to said first and second timing signal generating networks to again condition selectively said second AND gate to pass another anticipated signal.

15. A pulse signal filter comprising a first switching means conditioned initially to pass signals fed by a source of pulse signals, timing means activated by said first switching means to anticipate the time occurrence of a next related signal, blocking means coupled to condition said first switching means to block pulse signals after said timing means is activated, a second switching means conditioned selectively by said timing means to pass the anticipated signal, a third switching means coupled to said source of pulse signals and conditioned selectively by said timing means to block signals when said second switching means is conditioned to pass pulse signals, coupling means to feed the signal passed by said second switching means to said timing means to again condition selectively said second switching means to pass another anticipated signal, and reset means coupled to condition said first and third switching means to pass signals and said second switching means to block signals when the anticipated signal is absent.

16. A pulse signal filter comprising a first switching means conditioned initially to pass signals fed by a source of pulse signals, a first timing signal generating network and a second timing signal generating network each activated by said first switching means to anticipate the time of occurrence of a next related signal, blocking means coupled to condition said first switching means to block pulse signals after said first and second timing signal generating networks are activated, a second switching means conditioned selectively by said first and second timing signal generating networks to pass the anticipated signal, a third switching means coupled to said source of pulse signals and conditioned selectively by said first and second timing signal generating networks to block signals when said second switching means is conditioned to pass pulse signals, coupling means to feed the signal passed by said second switching means to said first and second timing signal generating networks to again condition selectively said second switching means to pass another anticipated signal, and reset means coupled to condition said first and third switching means to pass signals and said second switching means to block signals when the anticipated signal is absent.

17. A pulse signal filter comprising a first AND gate conditioned initially to pass signals fed by a source of pulse signals, a first timing signal generating network and a second timing signal generating network each activated by said first AND gate to anticipate the time of occurrence of a next related signal, blocking means coupled to condition said first AND gate to block pulse signals after said first and second timing signal generating networks are activated, a second AND gate conditioned selectively by said first and second timing signal generating networks to pass the anticipated signal, a third AND gate coupled to said source of pulse signals and conditioned selectively by said first and second timing signal generating networks to block signals when said second AND gate is conditioned to pass pulse signals, coupling means to feed the signal passed by said second AND gate to said first and second timing signal generating networks to again condition selectively said second AND gate to pass another anticipated signal, and reset means coupled to condition said first and third AND gates to pass signals and said second AND gate to block signals when the anticipated signal is absent.

References Cited in the file of this patent

UNITED STATES PATENTS 2,831,110 Trousdale -------------- Apr. 15, 1958